(12) United States Patent
Sakoh et al.

(10) Patent No.: US 7,638,369 B2
(45) Date of Patent: Dec. 29, 2009

(54) SEMICONDUCTOR CHIP AND METHOD OF FABRICATING THE SAME

(75) Inventors: Takashi Sakoh, Kanagawa (JP); Ryo Kubota, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 428 days.

(21) Appl. No.: 11/346,311

(22) Filed: Feb. 3, 2006

(65) Prior Publication Data

US 2006/0189042 A1 Aug. 24, 2006

(30) Foreign Application Priority Data

Feb. 24, 2005 (JP) ............................... 2005-048523

(51) Int. Cl.
*H01L 29/86* (2006.01)
*H01L 21/475* (2006.01)

(52) U.S. Cl. ................... 438/132; 438/467; 438/601; 257/529; 257/E21.314; 257/E21.232

(58) Field of Classification Search ................. 257/529; 438/132

See application file for complete search history.

(56) References Cited

U.S. PATENT DOCUMENTS 7,312,109 B2 * 12/2007 Madurawe ................. 438/138
2004/0018711 A1 * 1/2004 Madurawe ................. 438/598
2005/0181546 A1 * 8/2005 Madurawe ................. 438/132

FOREIGN PATENT DOCUMENTS

WO   WO 98/09327   3/1998

OTHER PUBLICATIONS

K. Arndt et al., Reliability of Laser Activated Metal Fuses in DRAMs, 1999 IEEE/CPMT Int'l Electronics Manufacturing Technology Symposium, p. 389-394.

* cited by examiner

*Primary Examiner*—Jerome Jackson, Jr.
(74) *Attorney, Agent, or Firm*—Young & Thompson

(57) ABSTRACT

There is provided a semiconductor chip having fuses. The semiconductor chip includes fuses each having a first terminal electrically connected to a first logic circuit, a second terminal electrically connected to a second logic circuit, and a blowable region formed between the first terminal and the second terminal; and fuse residues each having the same patterns with those of the first terminal and the second terminal of the fuses, and configured so that patterns corresponded to the first terminals and the second terminals are electrically disconnected from each other.

1 Claim, 17 Drawing Sheets

SEMICONDUCTOR CHIP AND METHOD OF FABRICATING THE SAME

This application is based on Japanese patent application No. 2005-048523 the content of which is incorporated hereinto by reference.

BACKGROUND

1. Technical Field

The present invention relates to a semiconductor chip having fuses, and a method of fabricating the same.

2. Related Art

Fuses are introduced into semiconductor devices for various purposes. Memories such as DRAM, for example, introduce the fuses for the purpose of redundancy replacement by which a redundant bit is allowed to operate in place of a fault bit (K. Arndt et al., Reliability of Laser Activated Metal Fuses in DRAMs, 1999 IEEE/CPMT Int'l Electronics Manufacturing Technology Symposium, p. 389-394). In this case, operations of a semiconductor device are tested after the wafer process, and if any fault bit is found, a fuse connected to the fault bit is blown in order to replace such fault bit with a redundant bit.

The fuses are also introduced among a plurality of target logic circuits for the purposes of regulating voltage or adjusting timings of the logic circuits in the semiconductor device. In this case, the internal voltages and timings are measured after the wafer process, and the fuses are blown so as to obtain a desired voltage or timing.

Still another example is such that a plurality of fuses are introduced and respectively correlated to information "1" or "0" depending on whether the fuse has been blown or not, so as to allow discrimination of the semiconductor device. For example, introduction of 128 fuses into every semiconductor chip allows storage of 128-bit information into each semiconductor chip. Allowing every semiconductor chip to hold different information makes it possible to use the fuses as a discriminator or identifier, and makes it possible to identify the individual semiconductor chips.

Japanese domestic re-publication of PCT International Publication for Patent Applications WO98/09327 discloses a technique of fabricating a gate array using an anti-fuse-system FPGA and having logic functions same as those of the FPGA, in which before and after forming the anti-fuse of FPGA, elements and interconnections in common to both of the FPGA and a gate array are formed on the same semiconductor substrate using a common photomask, and in the step of forming the anti-fuse section and contact holes of the correspondent gate array, photomasks specific to the both are used. The photomask specific to the gate array is produced using a pattern data obtained by converting write information for the anti-fuse section of the FPGA into contact hole information for the gate array. This makes it possible to fabricate the gate array having logic functions and performances absolutely same as those of the FPGA, and this reportedly raises an effect typically such that it becomes no more necessary to newly provide an interconnection arrangement step or a timing simulation step when the fabrication transits from FPGA process to gate array process.

The technique disclosed in WO98/09327 is, however, aimed at efficiently fabricate the gate array using the anti-fuse-system FPGA, having the same logic functions therewith, and thus-fabricated gate array has no fuses formed therein, so that the gate array no more allows programmable configuration of the logic circuits.

In the conventional semiconductor device having fuses introduced therein, fuses specified for disconnection are blown by laser irradiation or current supply. Increase in the number of fuses to be blown, therefore, raises a problem of needing more time for blowing the fuses, and of increasing the TAT (turn around time).

SUMMARY OF THE INVENTION

According to the present invention, there is provided a method of fabricating a semiconductor chip including:

forming, on a first semiconductor substrate, a plurality of fuses using a first fuse-forming mask having a plurality of fuse patterns formed thereon;

specifying a fuse to be blown among the plurality of fuses;

producing a second fuse-forming mask which has same patterns as those of the first fuse-forming mask other than those patterns corresponded to the specified fuse to be blown; and forming, on a second semiconductor substrate, the fuses using the second fuse-forming mask.

By forming the fuse using the second fuse-forming mask after specifying the fuse to be blown, it is made possible to shorten the TAT as compared with the case where the fuses are blown one by one by laser irradiation or the like.

It is also made possible to suppress the production cost and maintain the electrical characteristics and reliability of the semiconductor chip, by modifying the fuse-forming mask pattern only, while keeping other mask patterns and fabrication processes unchanged.

In the method of fabricating a semiconductor chip, the specifying the fuse to be blown further comprises selecting the fuse to be blown in common to a plurality of semiconductor chips, and specifying the fuse selected in this process step as the fuse to be blown.

For example, when a plurality of fuses are designed and provided for voltage regulation or timing adjustment, it may be found that some fuses are identified as the targets for always being blown in the subsequent process due to modification in design of the various components or fluctuation in the process. In another case, the same fuses may be identified as the targets for always being blown in the semiconductor chips fabricated in the same production line. In these cases, yield ratios of the semiconductor chips fabricated in the different production lines can be equalized, by specifying, for every production line, the fuses to be blown so as to adjust the operation margins and fluctuations in the operation speed, and by forming these fuses in a preliminarily-disconnected form.

As described in the above, as for the fuses to be blown in common to a plurality of the semiconductor chips, the TAT can be shortened more effectively by deletion of the fuse patterns on the mask, rather than by blowing with the aid of laser irradiation effected on every semiconductor chip.

As has been described in the above, the fuses in the present invention are formed using a second fuse-forming mask from which the patterns of the fuses to be blown in common to a plurality of semiconductor chips are deleted, so that the other fuses are formed similarly to as in the previous. A logic circuit of the semiconductor chip can, therefore, be configured in a programmable manner, by blowing the fuse in every semiconductor chip in the subsequent laser irradiation or the like if necessary.

In the method of fabricating a semiconductor chip, in the forming the second fuse-forming mask, the fuse pattern corresponded to the fuse specified in the specifying the fuse to be blown is deleted from the first fuse-forming mask, and a fuse residue pattern including only a part of the fuse pattern is provided where the fuse pattern was previously formed.

In the method of fabricating a semiconductor chip, wherein the forming the fuse using the second fuse-forming mask may further include:

forming, on the second semiconductor substrate, a fuse film composed of a fusible material;

forming a resist film on the fusible material;

patterning the resist film in a predetermined geometry, using the second fuse-forming mask; and etching the fusible material through the resist film.

The method of fabricating a semiconductor chip may further include, subsequently to the forming the fuse using the second fuse-forming mask;

specifying a fuse to be blown; and blowing the fuse to be blown.

The method of fabricating a semiconductor chip of the present invention may further include a step of forming, on the semiconductor substrate, logic circuits and fuse detection circuits detecting whether the individual fuses have been blown or not.

The fuse detection circuit may be provided corresponding to the sites where the fuses were previously formed, even for the case where the fuse pattern has been deleted from the second fuse-forming mask, allowing a configuration by which the fuses are detected as being not connected. This configuration makes it possible to allow the circuit to exhibit functions even after the fuse pattern has been deleted, similarly to those in the case where the fuses were blown after they were formed.

According to the present invention, there is also provided a method of fabricating a semiconductor chip which includes forming fuses using a mask having a plurality of fuse patterns formed thereon, including:

specifying a fuse to be blown in common to a plurality of semiconductor chips;

producing a mask having a fuse residue pattern which includes only a part of the fuse pattern, in place of the fuse pattern, in the site corresponded to the fuse to be blown; and forming fuses using the mask having the fuse residue pattern provided thereon.

One possible application is identification of a semiconductor chip, typically by introducing a plurality of fuses, and by correlating them with information "1" or "0" depending on whether the fuses have been blown or not. The fuses to be blown in common to a plurality of semiconductor chips may occur, for example, when code information expressing the production line is applied to the semiconductor chips fabricated in the same production line, or when code information expressing a version is applied to the semiconductor chips which belong to the same version.

As for such fuses to be blown in common to a plurality of semiconductor chips, the TAT can be shortened more effectively by deletion of the fuse patterns on the mask, rather than by blowing with the aid of laser irradiation or the like effected on every semiconductor chip. It is also made possible to configure the logic circuit of the semiconductor chip in a programmable manner by blowing the fuse with the aid of laser irradiation or the like in the subsequent process.

According to the present invention, there is provided a semiconductor chip having a first logic circuit and a second logic circuit formed therein, which includes:

a fuse having a first terminal electrically connected to the first logic circuit, a second terminal electrically connected to the second logic circuit, and a blowable region formed between the first terminal and the second terminal; and a fuse residue having the same patterns with those of the first terminal and the second terminal of the fuse, and configured so that the patterns corresponded to the first terminal and the second terminal are electrically disconnected from each other.

The fuse residue herein can be configured as having no blow mark possibly produced if it were blown by laser irradiation or current supply. The fuse residue having no such blow mark has a profile nearly vertical over the entire section. The geometry of the fuse residue may be, for example, such that containing patterns corresponded to the first terminal and the second terminal of the fuse, or may be such that containing also patterns corresponded to a part of the blowable region, in addition to those of the first terminal and the second terminal. Even for the case where the patterns corresponded to a part of the blowable region is contained, it is also allowable to adopt a geometry in which the pattern corresponded to a part of the blowable region is connected to both patterns corresponded to the first terminal and the second terminal, and it is still also allowable to adopt a geometry in which the patterns corresponded to a part of the blowable region is connected only to either one of them.

The fuse residue may be formed on the same plane with the fuse. An insulating film may be formed on the fuse residue and the fuse. The fuse residue can be configured as being covered with the insulating film on the top portion and side faces thereof. Even for the case where the fuse residue has a geometry in which the patterns corresponded to a part of the blowable region are connected to both patterns corresponded to the first terminal and the second terminal, the patterns corresponded to a part of the blowable region are isolated from each other by the insulating film. This configuration can avoid short-circuiting when a detection is made by a fuse detection circuit on whether the fuse residue has been blow or not.

The semiconductor chip of the present invention includes the preliminarily-disconnected, fuse-like fuse residue, and the fuse, so that the logic circuits of the semiconductor chip can be configured in a programmable manner by blowing the fuse when the situation demands. The fuse residue has no blow mark, so that it is also made possible to prevent intrusion of moisture or the like, and generation of voids. It is also made possible to shorten the process time of blowing of the fuse by laser irradiation or the like, and to efficiently fabricate the semiconductor chip, because the fuse preliminarily known to be blown is formed as the fuse residue.

The fuse residue contains the patterns same with those of the first terminal and the second terminal, so that, even for the case where interconnections and contact holes connected to the fuse are formed in a lower layer under the layer having the fuse residue and the fuse formed therein, it is made possible to connect these interconnections and the contact holes to the fuse residue, similarly to the case where the fuse is blown after the formation thereof, and to prevent corrosion, void formation and the like in the semiconductor chip.

The present invention consequently makes it possible to shorten the TAT in fabrication of a semiconductor chip having fuses, and to provide a highly-reliable semiconductor chip.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
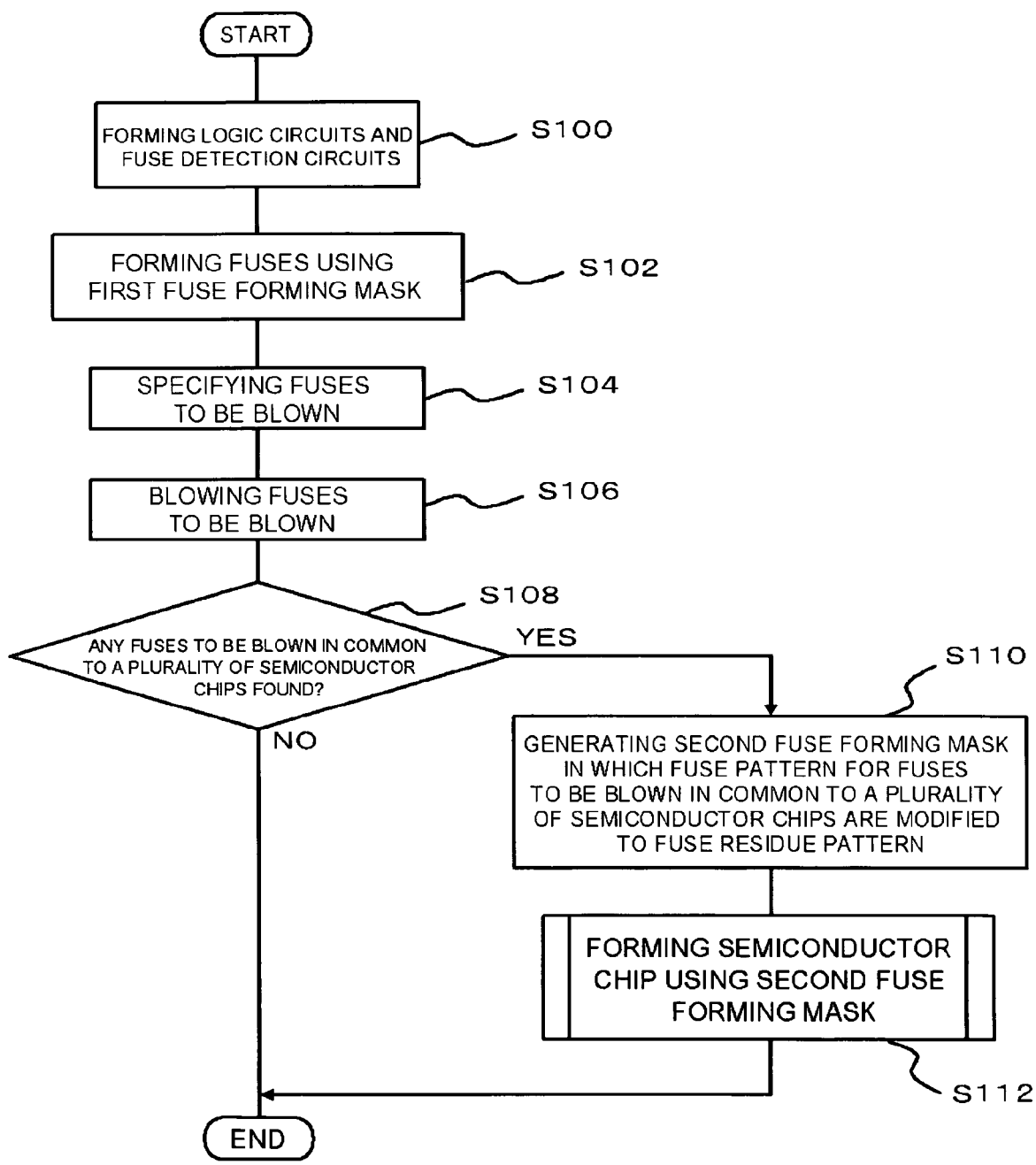
FIG. 1 is a flow chart showing procedures of fabricating a semiconductor chip in one embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Paragraphs below will describe embodiments of the present invention, referring to the attached drawings. It is to be noted that any similar constituents will be given with similar reference numerals, and the explanation to those will not be repeated for simplicity.

FIG. 1 is a flow chart showing procedures of fabrication of a semiconductor chip according to one embodiment of the present invention.

Figure 2:
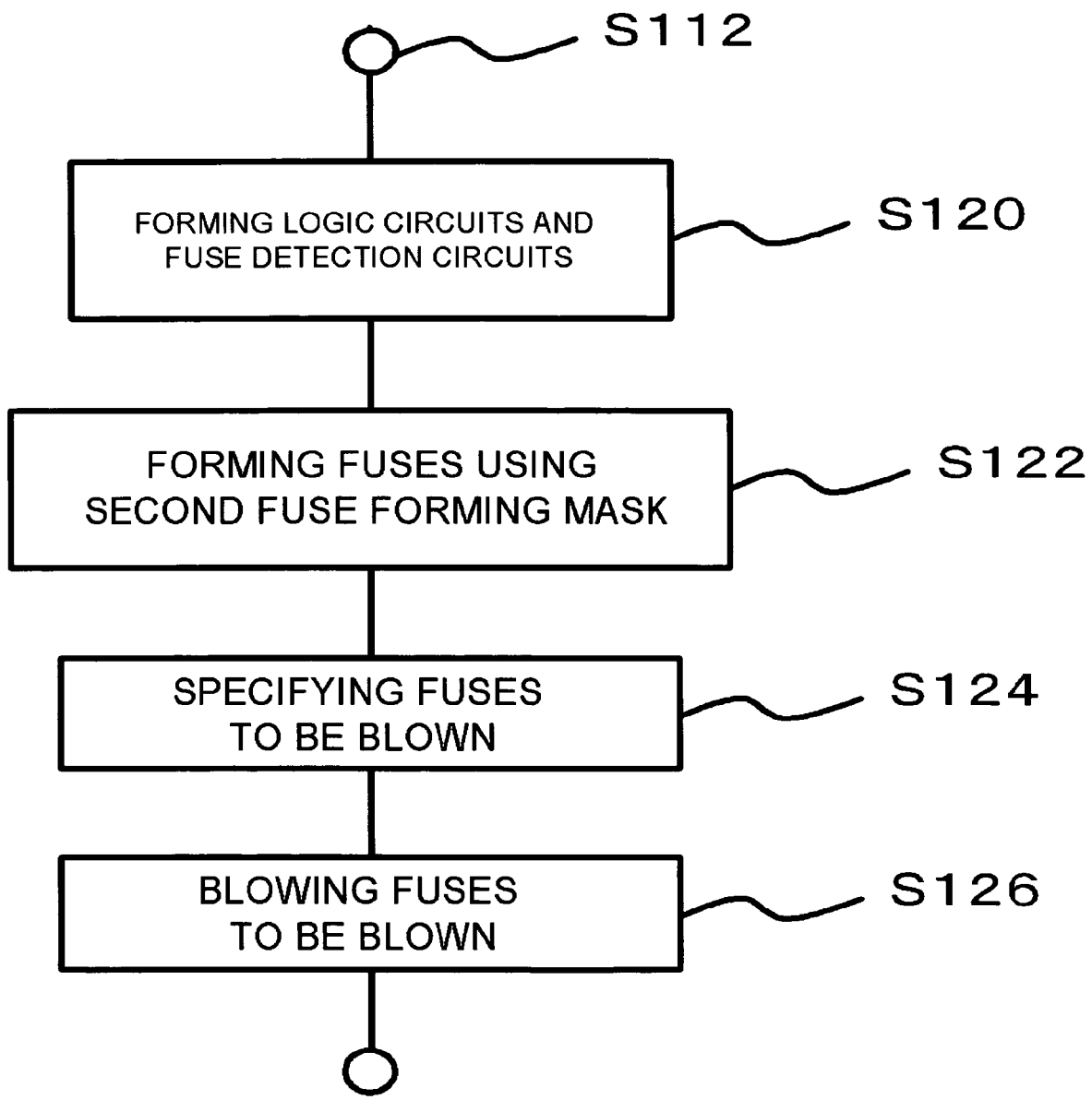
FIG. 2 is a flow chart detailing procedures in step S112 in FIG. 1.

The method of fabricating a semiconductor chip according to this embodiment includes a step of forming a plurality of fuses on a first semiconductor substrate, using a first fuse-forming mask having a plurality of fuse patterns formed thereon (S102), a step of specifying fuses to be blown among the plurality of fuses (S104), a step of producing a second fuse-forming mask from which a fuse pattern corresponded to the specified fuse to be blown is deleted compared with the first fuse-forming mask (S110), and a step of forming the fuses on a second semiconductor substrate, using the second fuse-forming mask (S112, in particular S122 in FIG. 2).

The individual steps will be explained below.

In the beginning, the first semiconductor substrate is obtained, and logic circuits and fuse detection circuits are formed on the first semiconductor substrate (S100). Next, using the first fuse-forming mask, a plurality of fuses are formed on the first semiconductor substrate (S102). Next, the fuses to be blown are specified using a test program or the like for the semiconductor chip (S104). The fuses to be blown specified in step S104 are then blown by laser irradiation or the like (S106). Next, the fuses to be blown in common among a plurality of semiconductor chips are found (S108).

If the fuses to be blown in common to a plurality of semiconductor chips are found (YES in S108), a new second fuse-forming mask will be formed as follows. As for the second fuse-forming mask, the fuse patterns corresponded to those fuses to be blown out of the plurality of fuses formed on the first fuse-forming mask are deleted, and instead the fuse-residue patterns containing only a part of the fuse pattern are produced where such fuse patterns were previously formed (S110).

Next, the semiconductor chip is fabricated using the second fuse-forming mask (S112). Detailed procedures therefor will be described later with referring to FIG. 2. Thereafter, the process comes to the end.

If no fuses to be blown in common to a plurality of semiconductor chips are found in step S108 (NO in step S108), the process comes to the end.

FIG. 2 is a flow chart detailing the procedure in step S112 in FIG. 1.

A second semiconductor substrate is newly obtained, and logic circuits and fuse detection circuits are formed on the second semiconductor substrate (S120). These procedures are same as those in step S100 in FIG. 1. Next, using the second fuse-forming mask produced in step S110 in FIG. 1, a plurality of fuses and fuse residues are formed on the second semiconductor substrate (S122). Next, using a test program for the semiconductor chip, the fuses to be blown are specified (S124). Next, the fuses to be blown specified in step S124 are blown by laser irradiation or the like (S126). The semiconductor chip is thus fabricated.

As described in the above, for the case where a plurality of the fuses to be blown in common to a plurality of semiconductor chips are found, the method of fabricating a semiconductor chip according to this embodiment prepares the second fuse-forming mask having, as the pattern corresponded to such fuses, the fuse residue pattern in which the fuses are provided in a preliminarily disconnected pattern, and forms the fuse residues using the mask. This makes it possible to save the process of chip-by-chip blowing of the fuses to be blown in common to a plurality of semiconductor chips, and to shorten the TAT (turn around time).

As for the fuses to be blown specific to each semiconductor chip, the fuses can be formed similarly to the conventional ones in the fuse forming step, and can thereafter be blown by laser irradiation or the like. This makes it possible to program information specific to each semiconductor chip using the fuses.

For example, it may also be possible to preliminarily fabricate a semiconductor device processed by the steps up to step S122 in FIG. 2, and to carry out steps S124 and S126 on delivery. This makes it possible to considerably shorten the process time for the delivery.

FIRST EMBODIMENT

The first embodiment will be described exemplifying a fuse used for regulating voltage between two logic circuits.

Figure 3:
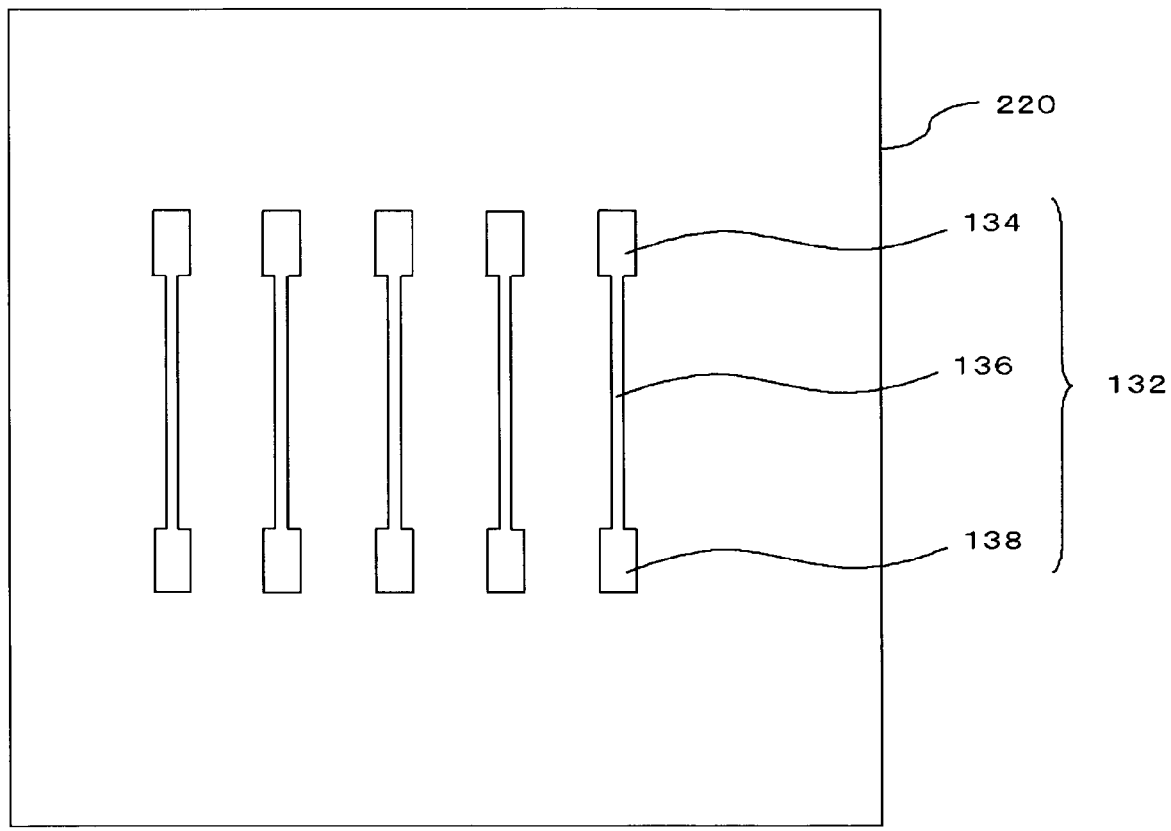
FIG. 3 is a top view showing a configuration of a first fuse-forming mask used in step S102 in FIG. 1.

FIG. 3 is a top view showing a configuration of the first fuse-forming mask used in step S102 in FIG. 1.

The first fuse-forming mask 220 has a plurality of fuse patterns 132 formed thereon. Each fuse pattern 132 includes a first terminal pattern 134, a blowable region pattern 136, and a second terminal pattern 138. The fuse pattern 132 may have other various geometries, without being limited to the geometry shown herein.

Figure 4:
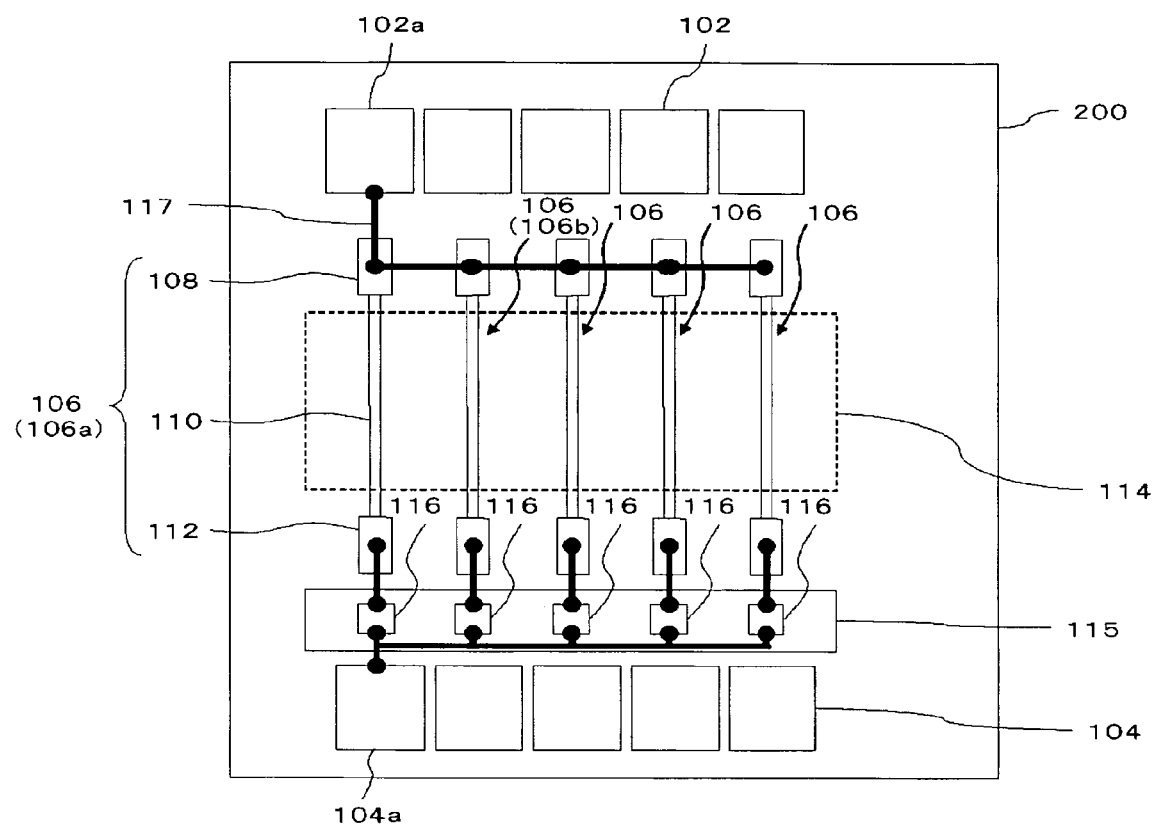
FIG. 4 is a schematic top view showing a configuration of a first semiconductor chip formed by using the first fuse-forming mask shown in FIG. 3.

FIG. 4 is a schematic top view showing a configuration of the first semiconductor chip 200 formed by using the first fuse-forming mask 220 shown in FIG. 3.

The first semiconductor chip 200 includes a plurality of fuses 106. Each fuse 106 includes a first terminal 108, a second terminal 112, and a blowable region 110 electrically connected thereto and disposed therebetween. In the first embodiment, blowable regions 110 of the fuses 106 to be blown are blown by laser irradiation. Although not shown, an insulating film is formed on the plurality of fuses 106. A portion of the insulating film over the blowable regions 110 of the plurality of fuses 106 has a fuse blowing recess 114 formed therein, as having a thickness smaller than that of the other regions.

In the first semiconductor chip 200, a plurality of logic circuits 102 are formed in the vicinity of the first terminals 108 of the fuses 106. In the vicinity of the second terminals 112 of the individual fuses 106, there are formed a fuse detection circuit unit 115 which includes a plurality of fuse detection circuits 116 electrically connected to each of the fuses 106. In the vicinity of the fuse detection circuit unit 115, a plurality of logic circuits 104 are formed.

In the first embodiment, one logic circuit (first logic circuit 102a) out of the plurality of logic circuits 102 is electrically connected through an interconnection 117 to one first terminal 108 of one (fuse 106a) of the fuses 106. Also the first terminals 108 of the plurality of fuses 106 are electrically connected one after another through the interconnection 117.

The plurality of fuse detection circuits 116 are electrically connected to each of the plurality of fuses 106, and detected whether each of the fuses 106 has been blown or not by each of the plurality of fuses 106. The fuse detection circuit unit 115 is electrically connected through the interconnection 117 to one logic circuit (second logic circuit 104a) out of the plurality of logic circuits 104.

The process of specifying a fuse to be blown in step S104 in FIG. 1 is carried out using thus-configured first semiconductor chip 200. Thereafter, whether any fuses to be blown in common to a plurality of semiconductor chips are found or not is judged in step S108 in FIG. 1. Whether any fuses to be blown in common to a plurality of semiconductor chips are found or not can typically be judged as described below.

For example, it may be found that operation margin or operation speed can be improved, if certain fuses are blown, after the semiconductor chip is fabricated by the processes from step S100 to step S106 and is carefully evaluated. In another exemplary case, in order to form an interconnection route so as to optimize the operation margin, operation speed and operation voltage between the first logic circuit and the second logic circuit, a possible solution may be such that a plurality of current routes are preliminarily formed on the first semiconductor chip by a parallel connection of a plurality of fuses, and an appropriate interconnection route (fuse) is specified by a practical test. This specifies also the fuses to be blown. In this case, the fuses to be blown are identified as the targets for blowing not only in a single semiconductor chip, but also in common to a plurality of semiconductor chips fabricated thereafter. If such fuses are found, the process of step S110 in FIG. 1 takes place.

Even when a certain sample is judged in step S108 as having the fuses to be blown in common to a plurality of semiconductor chips, it is also allowable herein to go into step S110 only after the processes from step S100 to step S106 are repeated several times so as to confirm whether the products can stably be produced, rather than going into step S110 immediately after the judgment.

Paragraphs below will describe an exemplary case where two fuses (fuse 106a and fuse 106b) out of the plurality of fuses 106 shown in FIG. 4 are judged as the targets for blowing in common to a plurality of semiconductor chips. In this case, the fuse patterns 132 corresponded to the fuse 106a and the fuse 106b out of the plurality of fuse patterns 132 of the first fuse-forming mask 220 shown in FIG. 3 are replaced with the fuse residue patterns when making a second fuse-forming mask.

Figure 5:
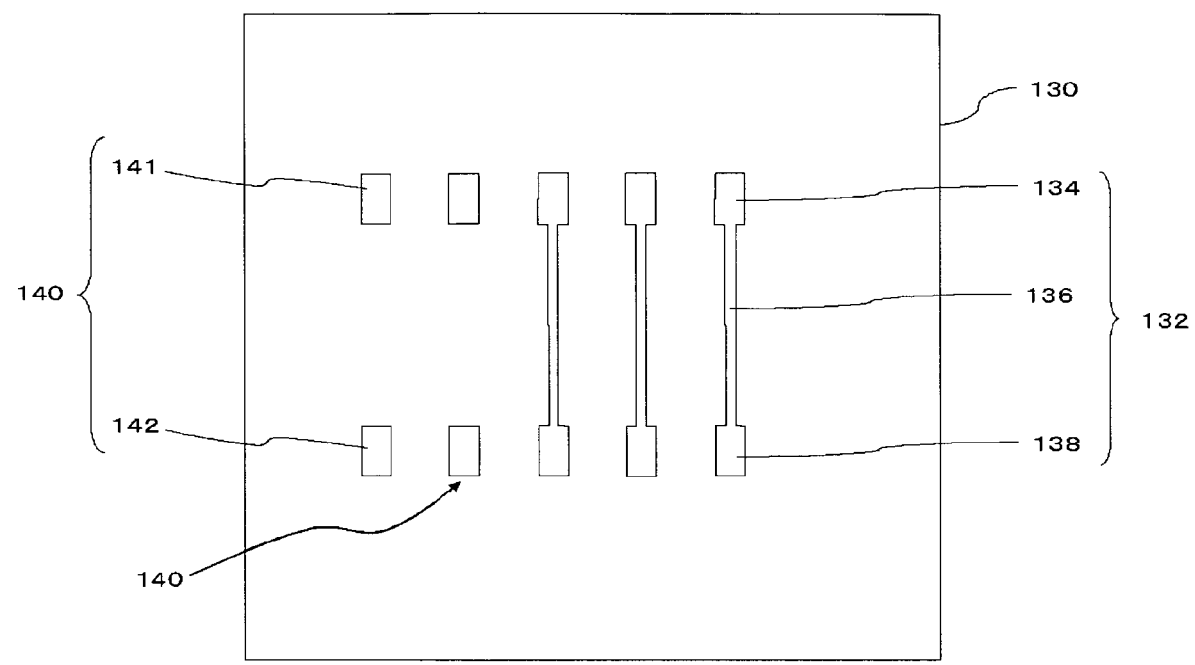
FIG. 5 is a top view showing a configuration of a second fuse-forming mask produced in step S110 in FIG. 5.

FIG. 5 is a top view showing a configuration of the second fuse-forming mask produced in step S110 in FIG. 1.

The second fuse-forming mask 130 has a plurality of fuse residue patterns 140 and a plurality of fuse patterns 132 formed thereon. Each fuse residue pattern 140 includes a first fuse residue pattern 141 and a second fuse residue pattern 142. The first fuse residue pattern 141 herein may have a pattern same as that of the first terminal pattern 134 in the fuse pattern 132. The second fuse residue pattern 142 may have a pattern same as that of the second terminal pattern 138 in the fuse pattern 132. In other words, the fuse residue pattern 140 in the first embodiment has the same pattern with the fuse pattern 132, except for having no blowable region pattern 136. The second fuse-forming mask 130 is used in step S122 shown in FIG. 2.

Figure 6:
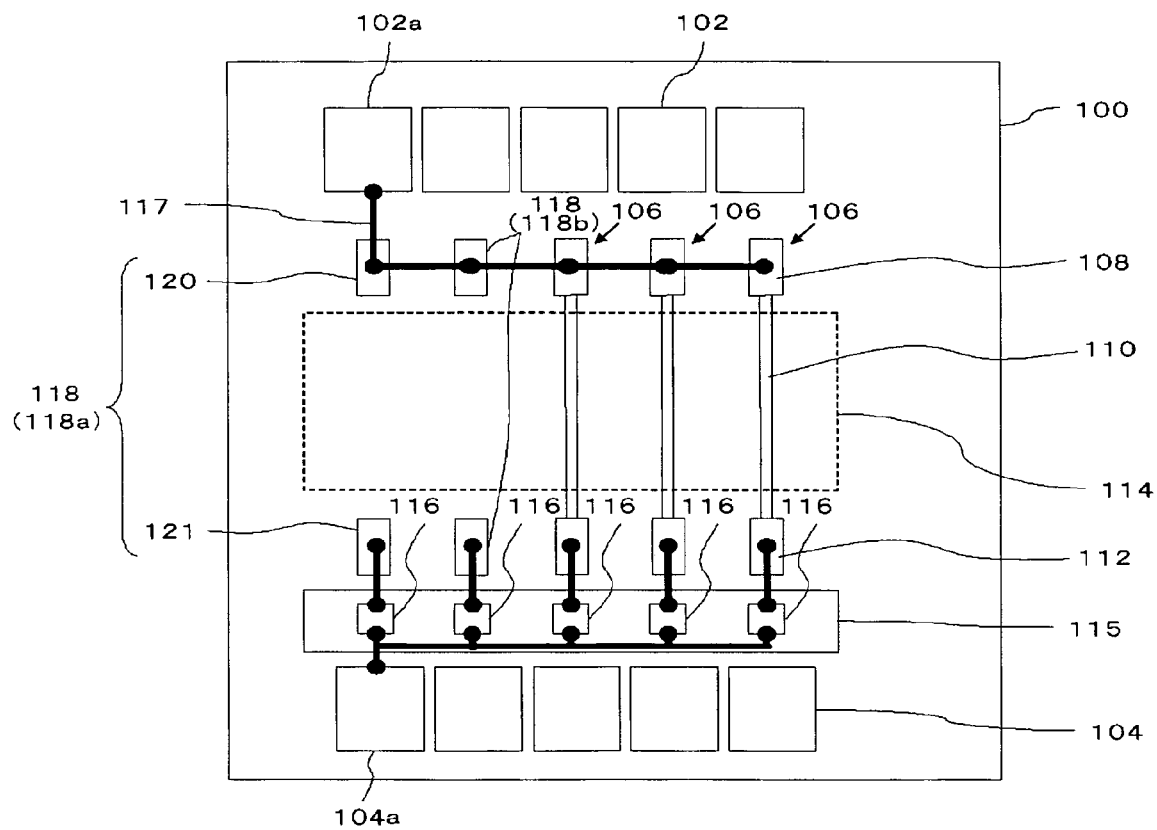
FIG. 6 is a schematic top view showing a configuration of a second semiconductor chip formed by using the second fuse-forming mask shown in FIG. 5.

FIG. 6 is a schematic top view showing a configuration of the second semiconductor chip 100 formed by using the second fuse-forming mask 130 shown in FIG. 5.

The second semiconductor chip 100 has the first logic circuits 102a and the second logic circuits 104a formed therein, and contains the fuses 106 each of which having a first terminal 108 electrically connected to the first logic circuit 102a, a second terminal 112 electrically connected to the second logic circuit 104a, and the blowable region 110 formed between the first terminal 108 and the second terminal 112; and fuse residues 118 each of which having patterns (first residue 120 and second residue 121) same as those of the first terminal 108 and the second terminal 112 of the fuses 106, and having the patterns (first residue 120 and second residue 121) corresponded to the first terminal 108 and to the second terminal 112 electrically disconnected from each other.

The second semiconductor chip 100 has a configuration similar to that of the first semiconductor chip 200, except for having the fuse residues 118 (fuse residue 118a and fuse residue 118b) in place of the fuse 106a and the fuse 106b, out of the plurality of the fuses 106 of the first semiconductor chip 200 shown in FIG. 4.

Each of the fuse residue 118a and the fuse residue 118b has the first residue 120 and the second residue 121. The first residue 120 herein may have a pattern same as that of the first terminal 108 of the fuse 106. The second residue 121 may have a pattern same as that of the second terminal 112 of the fuse 106. In other words, the fuse residue 118a and the fuse residue 118b in the first embodiment have patterns same as those of the fuses 106, except for having no blowable regions 110. The fuse residue 118a and the fuse residue 118b are formed at the places where the fuse 106a and the fuse 106b have previously been formed.

Figure 7:
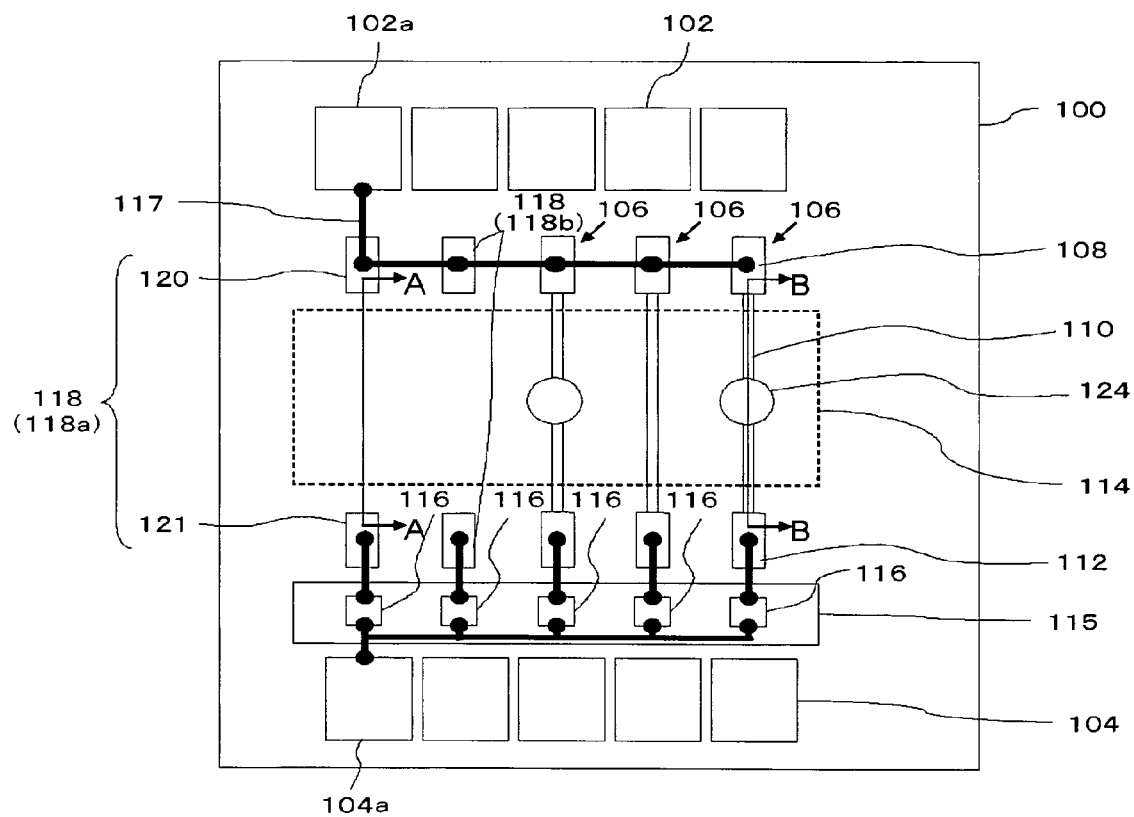
FIG. 7 is a schematic top view showing a state in which a part of a plurality of fuses formed on the second semiconductor chip shown in FIG. 6 was blown by laser irradiation.

FIG. 7 is a schematic top view showing a state in which a part of a plurality of fuses 106 formed on the second semiconductor chip 100 shown in FIG. 6 was blown by laser irradiation.

Of the fuses 106 of the second semiconductor chip 100, the fuses to be blown are specified in the process of step S124 and step S126 in FIG. 2, and are then blown.

Of the plurality of fuses 106 having been formed as shown in FIG. 6, the fuses 106 composing interconnection routes optimum for connecting the first logic circuit 102a and the second logic circuit 104a are determined, and the other fuses 106 are judged as the targets for blowing. The fuses 106 judged as the targets for blowing are blown by laser irradiation above from the fuse blowing recess 114. This makes it possible to program information specific to each second semiconductor chip 100.

In the shown case, the third fuse 106 from the right and the rightmost fuse 106 are blown by laser irradiation. Each of these fuses 106 has a blow mark (site of blowing) 124.

In thus-configured second semiconductor chip 100, the fuses 160 are detected, from the left, as being "blown", "blown", "blown", "connected" and "blown", by the fuse detection circuits 116 of the fuse detection circuit unit 115.

Figure 8:
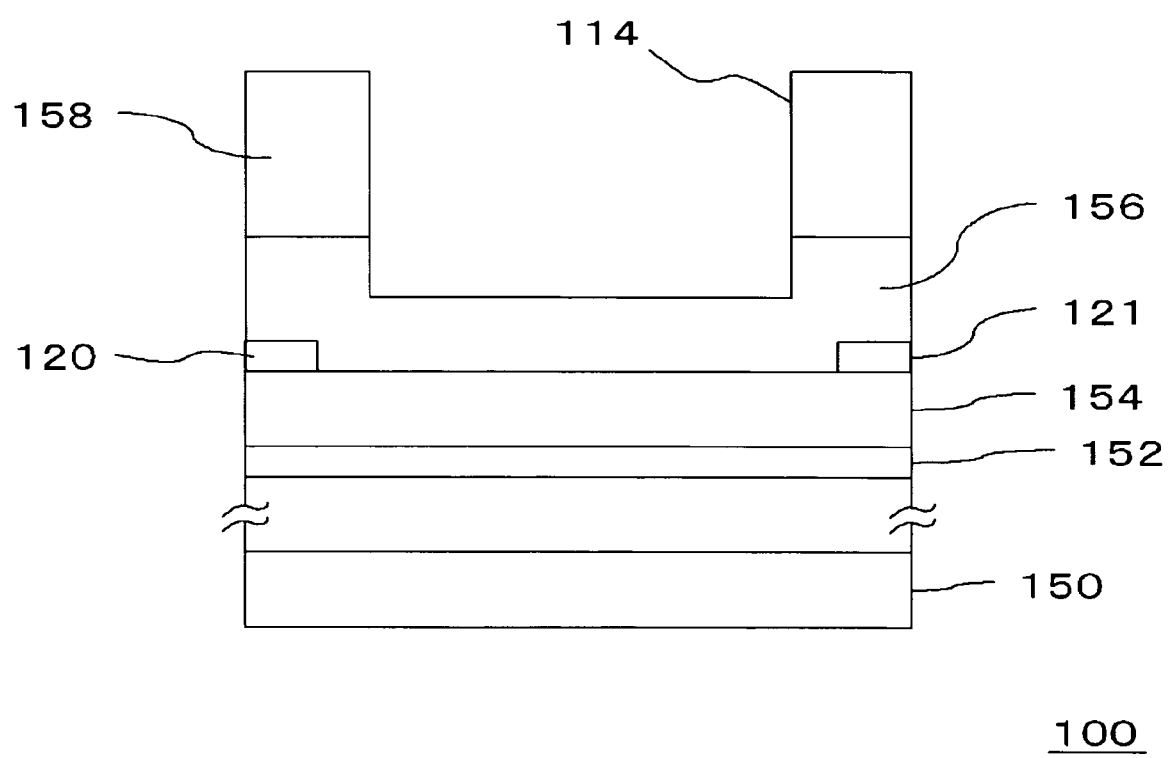
FIG. 8 is a sectional view taken along line A-A in FIG. 7.

FIG. 8 is a sectional view taken along line A-A in FIG. 7, showing herein a region having the fuse residue 118 formed therein.

The second semiconductor chip 100 is configured as having a semiconductor substrate 150, an underlying insulating film 152, a first insulating film 154, the first residue 120 and the second residue 121, a second insulating film 156, and a polyimide film 158 stacked in this order. Although not illustrated herein, the semiconductor substrate 150 has the logic circuits 102, the logic circuits 104, the fuse detection circuits 116, interconnections 117 and so forth formed thereon. The second insulating film 156 may typically be composed of SiON. The second insulating film 156 and the polyimide film 158 have the fuse blowing recess 114 formed therein.

Figure 9:
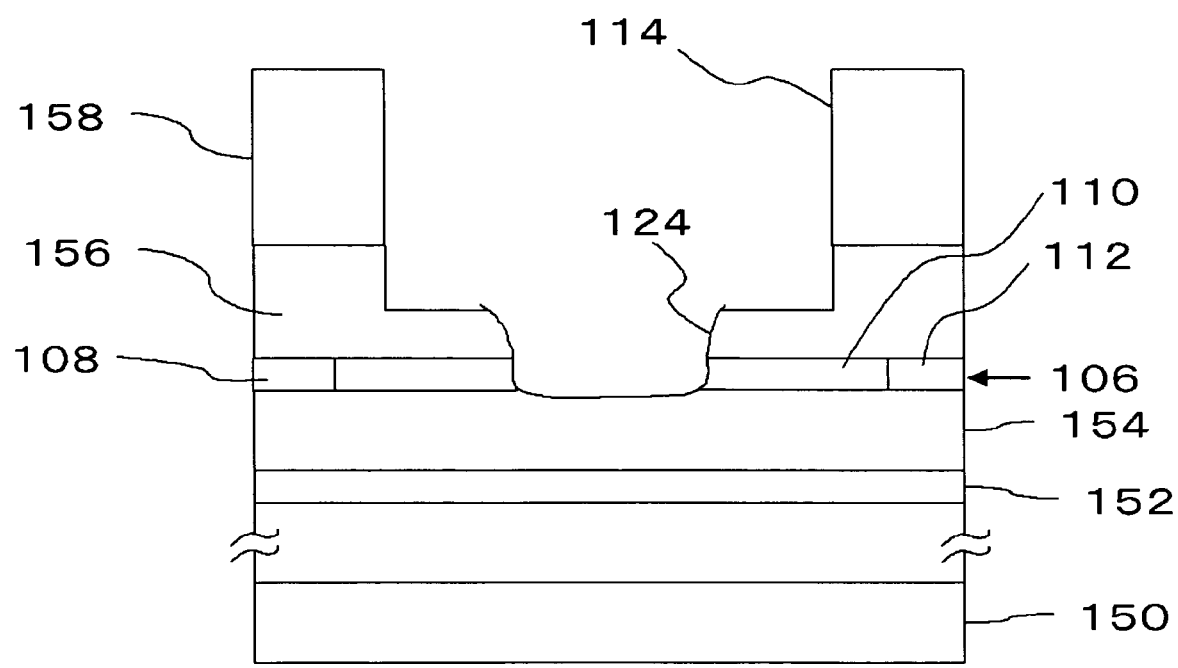
FIG. 9 is a sectional view taken along line B-B in FIG. 7.

FIG. 9 is a sectional view taken along line B-B in FIG. 7, showing a region having the fuse 106 blown therein.

On the first insulating film 154, the first terminal 108, the blowable region 110, and the second terminal 112 are formed. The blowable region 110 is blown by laser irradiated above from the fuse blowing recess 114, and consequently has the blow mark 124.

Next paragraphs will describe procedures of forming the fuses using the second fuse-forming mask 130, referring to FIG. 8 and FIG. 9.

First, on the first insulating film 154 formed on the semiconductor substrate 150, a fuse film composed of a fusible material is formed. The fusible material may be general ones blowable by laser irradiation or current supply. Applicable examples of the fusible material include polysilicon film, titanium film and titanium nitride film. Next, a resist film composed of a photoresist is formed on the fuse film.

Next, the resist film is processed in a predetermined geometry using the second fuse-forming mask 130. The fuse film is then etched by dry etching through a mask of thus-processed resist film. By this process, the fuse residues 118a and 118b, and a plurality of fuses 106 are formed on the first insulating film 154.

Next, the second insulating film 156 is formed on the fuse residues 118a, 118b and the fuses 106 on the first insulating film 154. Next, a polyimide film 158 is formed on the second insulating film 156. Thereafter, the polyimide film 158 and the second insulating film 156 are removed selectively on the region having the blowable regions 110 of the fuses 106 formed therein, to thereby form the fuse blowing recess 114. In this process, the fuse blowing recess 114 is provided also on the region having the fuse residues 118a and 118b formed therein. This is because the region, having the fuse residues 118a and 118b formed therein, had the fuses 106a and 116b formed therein in the original design, and a pattern design for forming the fuse blowing recess 114 was adopted without modification.

According to the second semiconductor chip 100 of the first embodiment, fuses to be blown in common to a plurality of semiconductor chips are formed using a second fuse-forming mask 130 in which the fuse patterns corresponded to such fuses are preliminarily replaced by the fuse residue patterns. The fuse residues 118a and 118b formed using the fuse residue patterns can, therefore, be configured as having no blow mark caused by laser or current. This makes it possible to avoid intrusion of moisture or the like, and generation of voids, and to thereby raise the reliability of the second semiconductor chip 100.

In the first embodiment, the second semiconductor chip 100 is fabricated by the process same as that of the first semiconductor chip 200, except that the fuses are formed using the second fuse-forming mask 130. This makes it possible to save the costs. The sites where the fuse residue 118a and fuse residue 118b are formed in the second semiconductor chip 100 correspond to the sites where the fuses 106 in the first semiconductor chip 200 are formed. Lower layers, under the layer having the fuse 106, fuse residues 118a, 118b and so forth formed therein, are therefore designed to have contact holes and interconnections, assuming that the fuses 106 should have been formed in the sites where the fuse residues 118a and 118b are actually formed. The fuse residues 118a and 118b in the first embodiment have the first residues 120 and the second residues 121 having the patterns same as those of the first terminals 108 and the second terminals 112 of the fuses 106. It is therefore made possible, even for the case where the interconnections or contact holes provided for connection with the fuses 106 are formed in the lower layers under the layer having the fuses 106, fuse residues 118a, 118b and so forth formed therein, to connect these interconnections and contact holes with the first residues 120 and the second residues 121 of the fuse residues 118a and 118b, and to avoid erosion, void formation and so forth in the second semiconductor chip 100.

Figure 10:
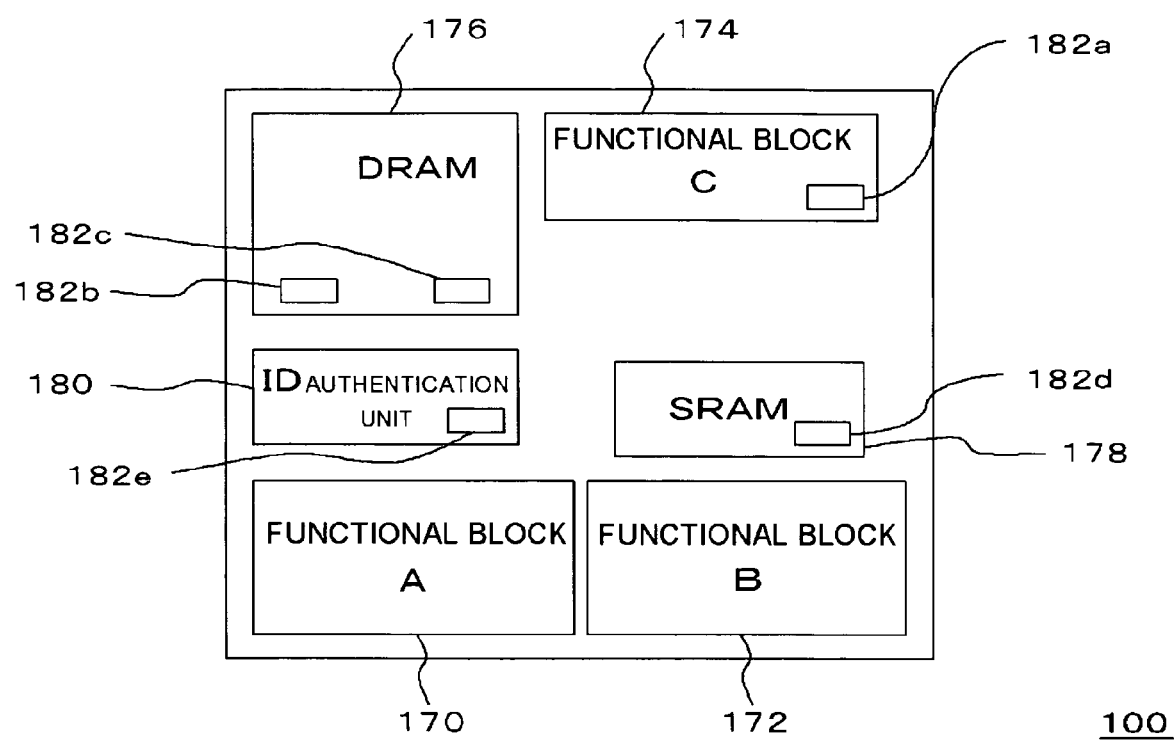
FIG. 10 is a top view showing a configuration of functional blocks of the second semiconductor in one embodiment.

FIG. 10 is a top view showing a configuration of a functional block of the second semiconductor chip 100 in the first embodiment.

The second semiconductor chip 100 includes a functional block A 170, a functional block B 172, a functional block C 174, a DRAM 176, an SRAM 178, and an ID authentication unit 180. The second semiconductor chip 100 includes a plurality of fuse blocks 182a, 182b, 182c, 182d and 182e. Each fuse block has a configuration in which a plurality of fuses 106 or fuse residues 118 are arranged in parallel with each other. In each of the fuse blocks, the plurality of fuses 106 or the fuse residues 118 are arranged at intervals of n×d (d represents a predetermined pitch, and n represents an integer of 1 or larger). For example, in FIG. 6 and FIG. 7, a plurality of fuses 106 and/or fuse residues 118 are arranged in parallel at regular intervals, whereas it is not always necessary to arrange the fuses at regular intervals, and some of the fuses 106 or the fuse residues 118 may not be formed so as to provide a partially "toothless" arrangement. Each fuse block may have the fuses 106 and the fuse residues 118 mixed therein, or may be configured as having the fuses 106 only or having the fuse residues 118 only.

The plurality of fuse blocks may be used for various applications. For example, the fuse block 182a provided to the functional block C 174 may be used for voltage regulation or timing adjustment, similarly to as exemplified in the first embodiment.

The fuse blocks 182b, 182c, and the fuse block 182d provided to the DRAM 176 and the SRAM 178, respectively, can be used for redundancy replacement.

The fuse block 182e provided to the ID authentication unit 180 can be used for identifying the second semiconductor chip 100.

Figure 11:
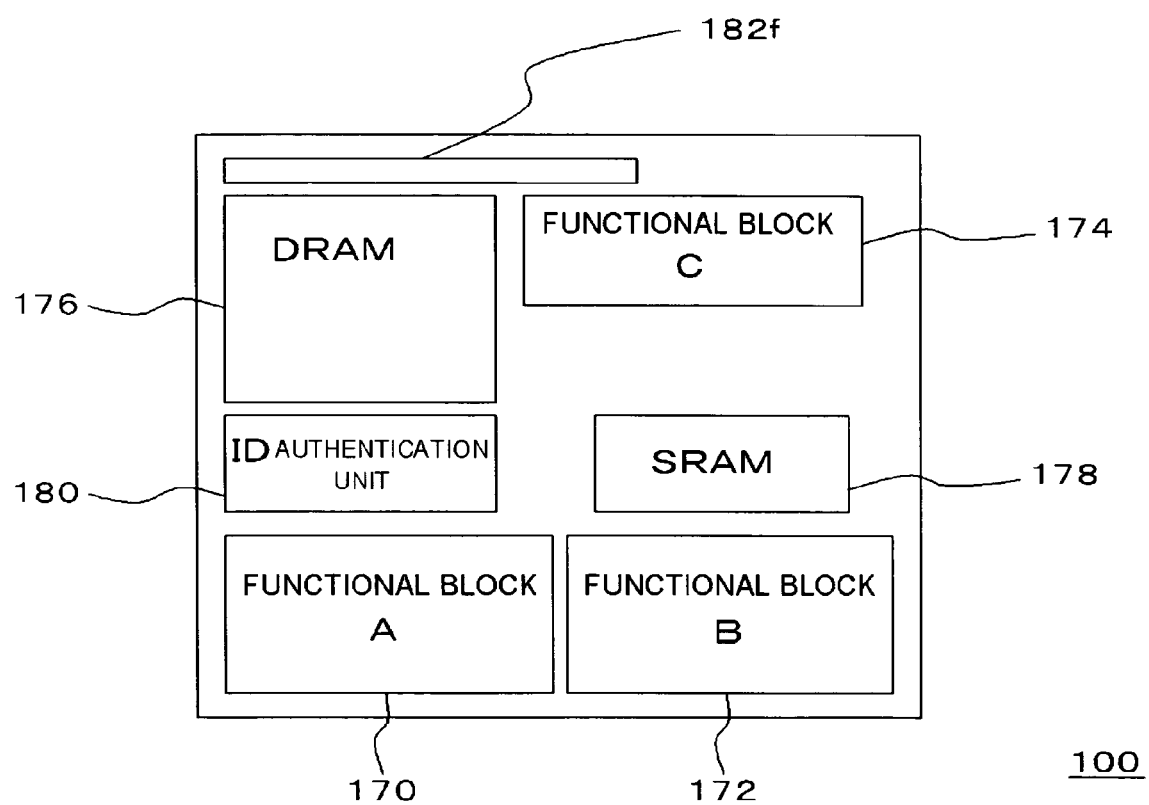
FIG. 11 is a top view of another exemplary configuration of the functional blocks of the second semiconductor chip of one embodiment.

FIG. 11 is a top view showing another exemplary configuration of the functional blocks of the second semiconductor chip 100 according to the first embodiment.

FIG. 10 showed a configuration in which a plurality of functional blocks were arranged in a distributed manner on the second semiconductor chip 100, whereas it is also allowable to arrange the fuse blocks having various functions at a single site in a concentrated manner. A fuse block 182f shown in FIG. 11 is a result of integration of the fuse blocks 182a to 182e at a single site, explained referring to FIG. 10.

According to the method of fabricating a semiconductor chip of the first embodiment, fuses to be blown in common to a plurality of semiconductor chips are formed by replacing the fuse pattern on the fuse-forming mask with the residue patterns. It is therefore made possible to omit a step of blowing the fuses by laser irradiation or the like, after they were once formed, and to consequently shorten the TAT in fabrication of the semiconductor chip.

In addition, as the unblown fuses are formed in the fuse formation, it is also made possible, in the subsequent process steps, to blow the fuses necessary for adjustment for every semiconductor chip.

The residues are formed also for the fuses to be blown in common to a plurality of semiconductor chips, and whether the fuses have been blown or not is detected by the fuse detection circuit, so that it is still also made possible to manage the semiconductor chips based on the state of blowing of the fuses, similarly to the conventional semiconductor chip.

Formation of the residues also facilitates an on-circuit authentication of the second fuse-forming mask 130. The fuse residue 118 has the first residue 120 and the second residue 121 corresponded to the first terminal 108 and the second terminal 112 of the fuse 106. This also makes it possible to prevent the contact holes, which are formed in a layer underlying the layer having the fuses 106 and fuse residues 118a, 118b formed therein, from being eroded by an etching gas, when the fuse film composed of a fusible material is etched off to leave a predetermined pattern.

Formation of the fuse residues configured as being preliminarily disconnected, using the mask corresponded to the fuses to be blown in common to a plurality of semiconductor chips, also makes it possible to form the fuses in a blown state, more stably than in the case where the blowing is effected by laser irradiation or the like.

Second Embodiment

Also in the second embodiment, fuses regulating voltage between two logic circuits will be described similarly to as in the first embodiment. In the second embodiment, the geometry of the fuse residues 118 differ from that in the first embodiment.

Figure 12:
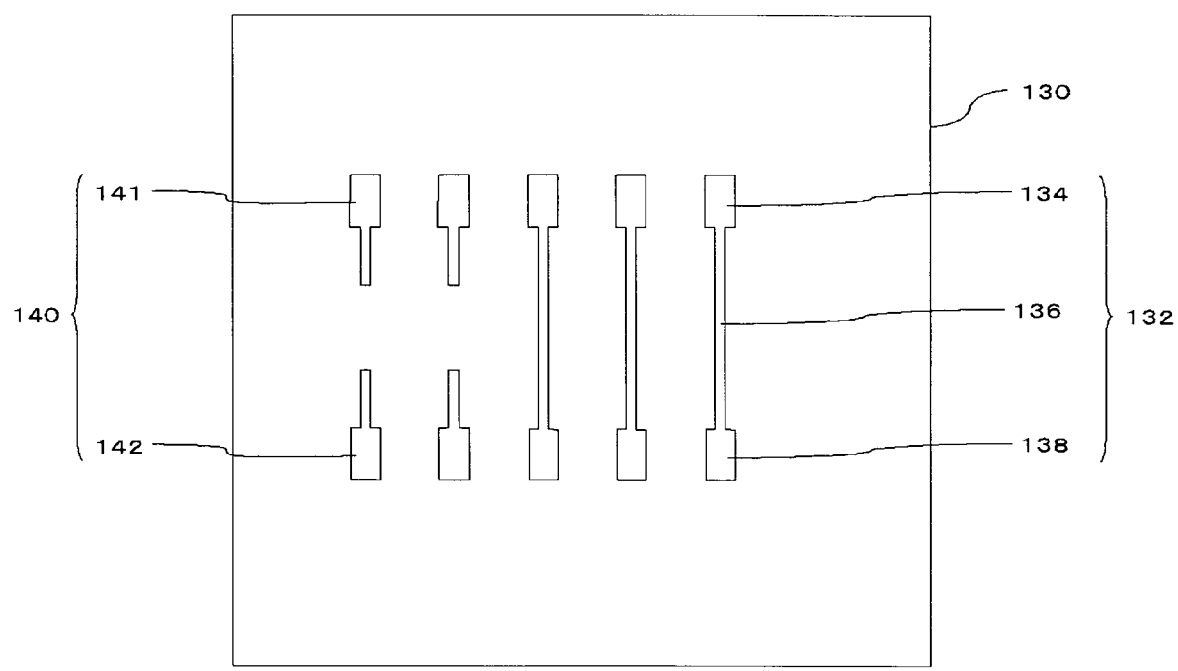
FIG. 12 is a top view showing a configuration of a second fuse-forming mask in one embodiment.

FIG. 12 is a top view showing a configuration of the second fuse-forming mask 130 in the second embodiment.

The first fuse residue pattern 141 of the fuse residue pattern 140 in the second embodiment has, in addition to a pattern same as that of the first terminal pattern 134 of the fuse pattern 132, a pattern same as that of a part of the blowable region pattern 136. The second fuse residue pattern 142 of the fuse residue pattern 140 has, in addition to a pattern same as that of the second terminal pattern 138 of the fuse pattern 132, a pattern same as that of a part of the blowable region pattern 136. The first fuse residue pattern 141 and the second fuse residue pattern 142 herein are not connected to each other.

Figure 13:
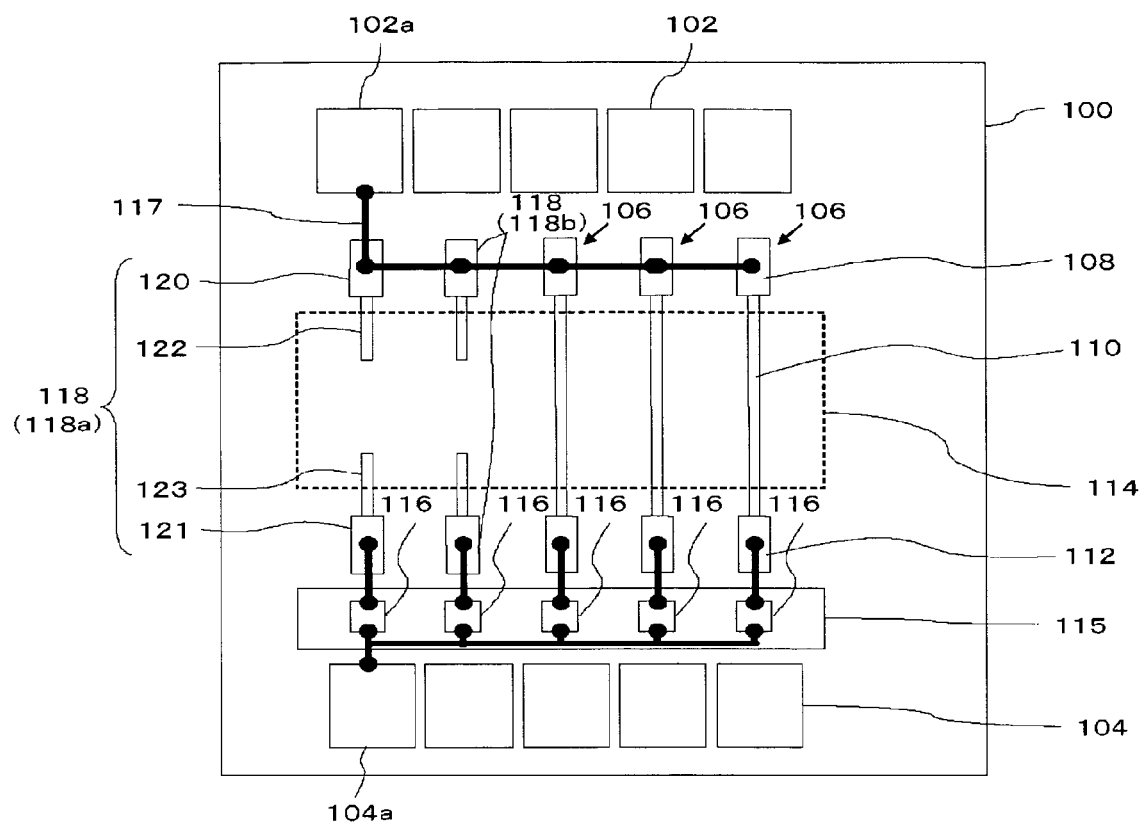
FIG. 13 is a schematic top view of the second semiconductor chip formed by using the second fuse-forming mask shown in FIG. 12.

FIG. 13 is a schematic top view showing a configuration of the second semiconductor chip 100, formed by using the second fuse-forming mask 130 shown in FIG. 12.

In the second semiconductor chip 100, each of the fuse residue 118a and fuse residue 118b has the first residue 120, the second residue 121, a third residue 122 connected to the first residue 120, and a fourth residue 123 connected to the second residue 121. Each of the third residue 122 and the fourth residue 123 has a pattern such that a part of the blowable region 110 of the first fuse 106a or of the second fuse 106b is removed.

Figure 14:
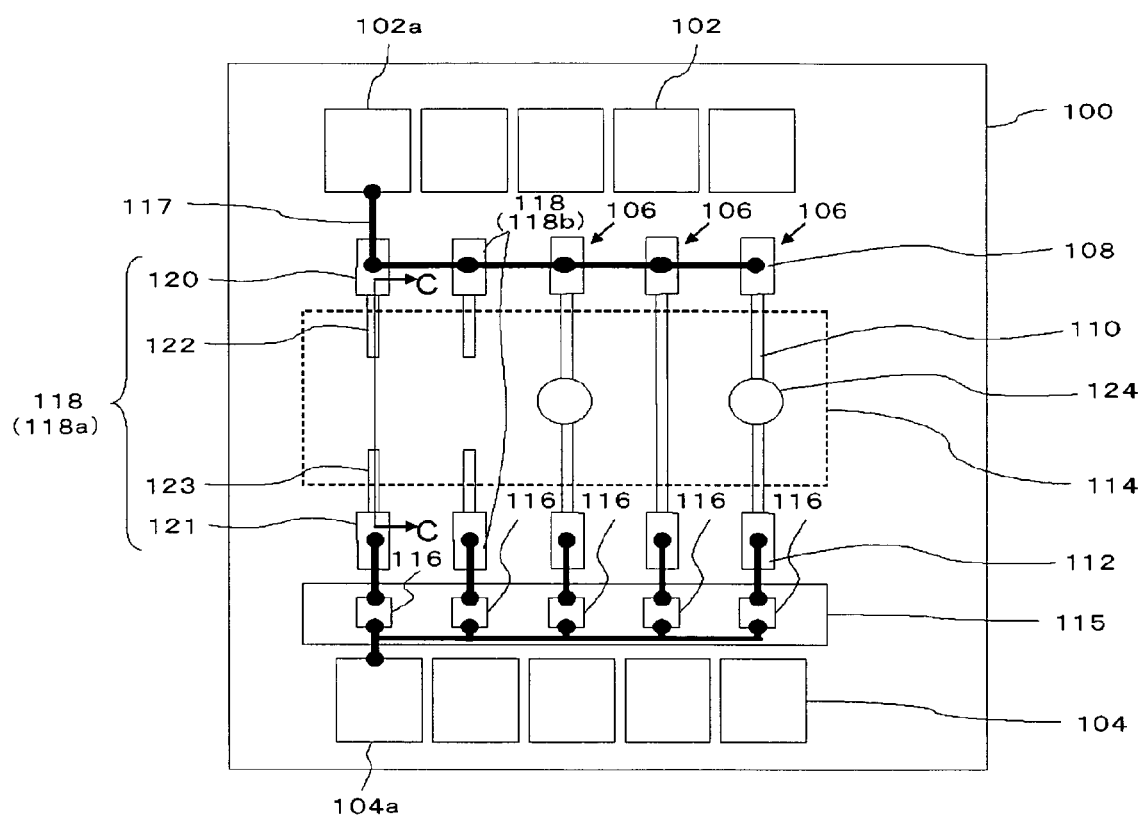
FIG. 14 is a top view showing a state in which a part of a plurality of fuses formed on the second semiconductor chip shown in FIG. 13 was blown by laser irradiation.

FIG. 14 is a schematic top view showing a state in which some of the fuses out from the plurality of fuses formed on the second semiconductor chip 100 shown in FIG. 13 were blown by laser irradiation.

Of three fuses 106 formed as shown in FIG. 13, a fuse capable of composing an optimum route for connecting the first logic circuit 102a and the second logic circuit 104a is judged, and the other fuses 106 are judged as the targets for blowing. The fuses 106 judged as the targets for blowing are blown by being irradiated by laser above from the fuse blowing recess 114. This makes it possible to program information specific to each of the second semiconductor chips 100.

In the shown case, the third fuse 106 from the right and the rightmost fuse 106 are blown by laser irradiation. Each of these fuses 106 has a blow mark 124.

In thus configured second semiconductor chip 100, the fuses 160 are detected, from the left, as being "blown", "blown", "blown", "connected" and "blown", by the fuse detection circuits 116 of the fuse detection circuit unit 115.

Figure 15:
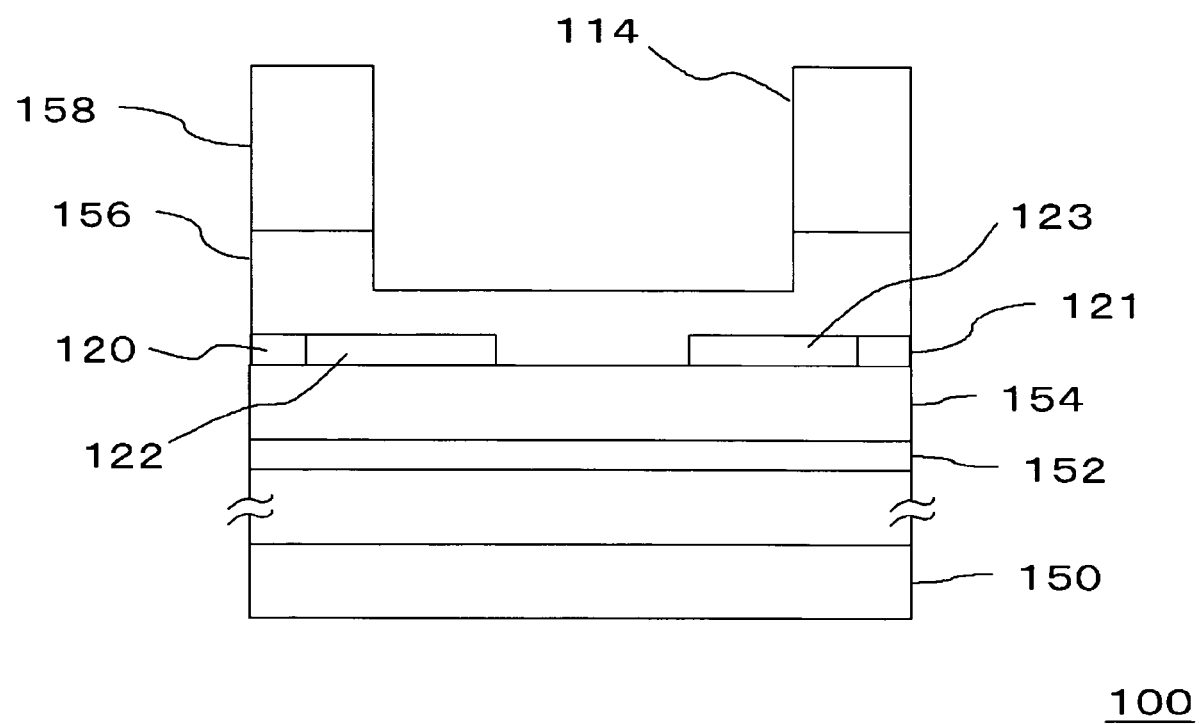
FIG. 15 is a sectional view taken along line C-C in FIG. 14.

FIG. 15 is a schematic view taken along line C-C in FIG. 14.

In the second embodiment, the third residue 122 and the fourth residue 123 are formed below the fuse blowing recess 114. Provision of such thin patterns of the fuse residue 118a and the fuse residue 118b below the fuse blowing recess 114 improves the visibility, allows visual confirmation of presence or absence of the fuses, and facilitates the authentication on the circuit.

Third Embodiment

Also in the third embodiment, fuses regulating voltage between two logic circuits will be described similarly to as in the first and second embodiments. The third embodiment differs from the first embodiment and the second embodiment, in that the fuses 106 are blown by current supply.

Figure 16:
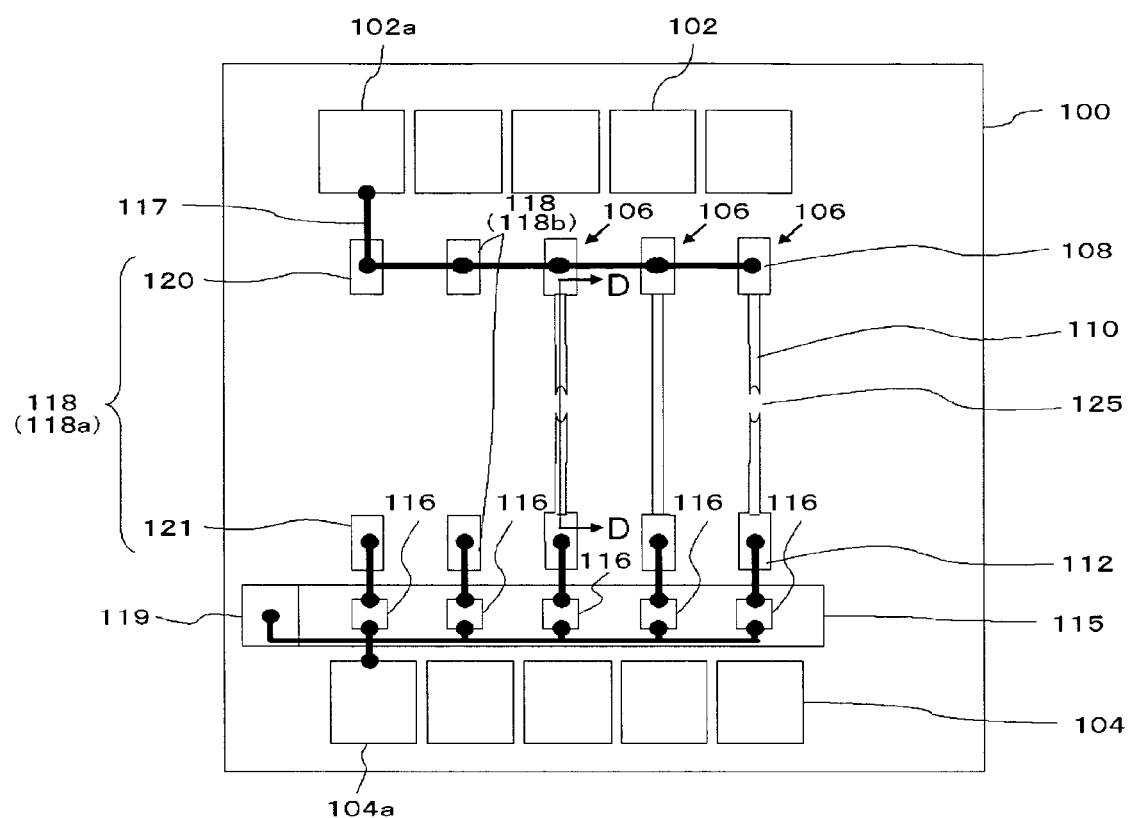
FIG. 16 is a schematic top view showing a configuration of the second semiconductor chip in which the fuses to be blown are blown by current supply, rather than laser irradiation.

FIG. 16 is a schematic top view showing a configuration of the second semiconductor chip 100 in which the fuses 106 to be blown are blown by current supply, rather than laser irradiation.

In the third embodiment, the second semiconductor chip 100 further includes a current generation circuit 119. The target fuses 106 can be blown by being supplied with current generated by the current generation circuit 119.

Figure 17:
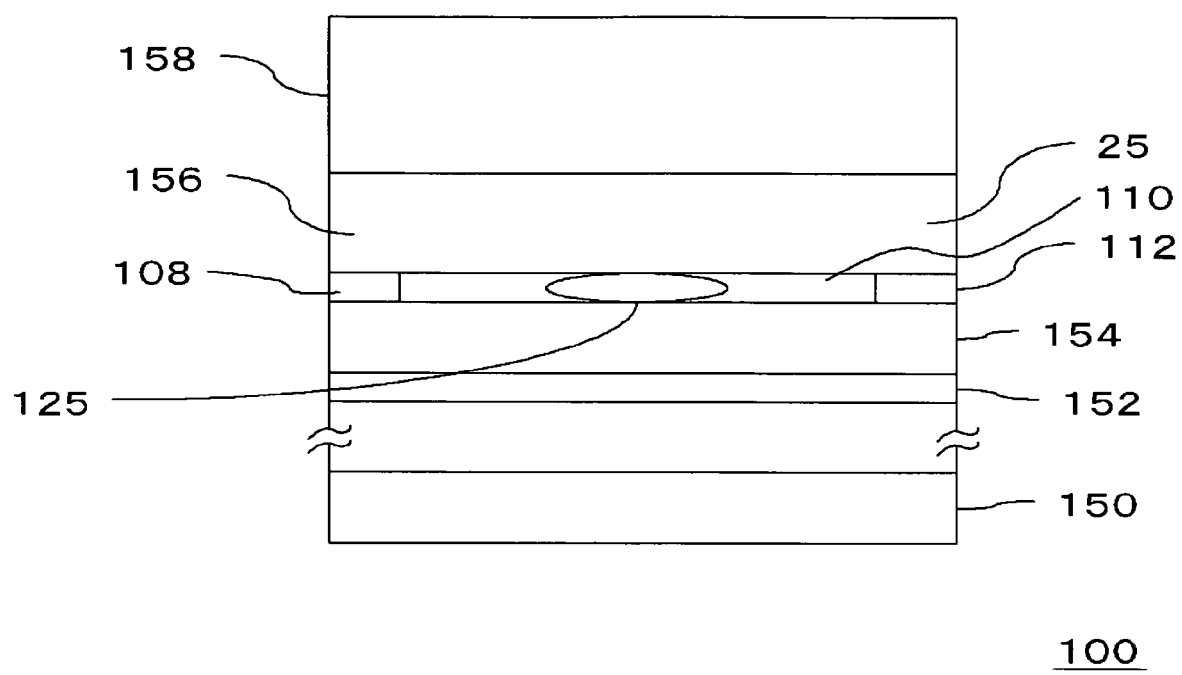
FIG. 17 is a sectional view taken along line D-D in FIG. 16.

FIG. 17 is a sectional view taken along line D-D in FIG. 16.

In the third embodiment, there is no need of forming the fuse blowing recess 114 to the second insulating film 156 and the polyimide film 158. The blowable region 110 can electrically be disconnected by the blow mark (site of blowing) 125 such as a void.

The embodiments and examples of the present invention described in the above referring to the attached drawings are examples of the present invention, and allows adoption of various configurations other than those described in the above.

The embodiments in the above have exemplified the fuses regulating voltage between two logic circuits. The technical spirit of the present invention is, however, by no means limited to these embodiment, and is applicable also to the fuses adjusting timing among the logic circuits in the semiconductor chip, or to the fuses identifying the semiconductor chips based on whether the fuses are blown or not. It is also applicable to the case where the semiconductor chip contains the fuses allowing DRAM or other memory to operate after replacing unacceptable bits with redundant bits and the fuses provided for other applications described in the above.

In an exemplary case where the fuses are used for identifying the semiconductor chips, step S100 to step S108 explained referring to FIG. 1 in the above embodiment are omissible. This is because the fuses in common to a plurality of semiconductor chips can be specified in this case, without practically fabricating the real semiconductor chips using the first fuse-forming mask.

Another allowable configuration is such that a single fuse detection circuit is provided to a plurality of fuses.

The DRAM and other functional blocks exemplified in the embodiment may be modified such as being added or deleted, so as to be adoptable to desired functions of the semiconductor chip, and the present invention is applicable to any logic circuits in need of fuses.

It is apparent that the present invention is not limited to the above embodiments, that may be modified and changed without departing from the scope and spirit of the invention.

What is claimed is:

1. A method of fabricating semiconductor chips by forming fuses with a mask having a plurality of fuse patterns formed thereon, comprising:

forming a plurality of fuses on a first semiconductor substrate using a first fuse-forming mask;

from among the plurality of fuses on said first semiconductor substrate, identifying a fuse to be blown that is common to each of a plurality of second semiconductor substrates;

producing a second fuse-forming mask having a plurality of fuse patterns corresponding to said plurality of fuses except said fuse to be blown, said second fuse-forming mask having a fuse residue pattern which includes only an incomplete part of a fuse pattern at a site corresponding to said fuse to be blown; and on each of said second semiconductor substrates, forming said plurality of fuses and said part of a fuse pattern using said second fuse-forming mask.

* * * * *